(12) United States Patent
Lee et al.

(10) Patent No.: US 11,281,045 B2
(45) Date of Patent: Mar. 22, 2022

(54) COLOR CONVERSION ELEMENT AND DISPLAY DEVICE INCLUDING THE SAME

(71) Applicant: Samsung Display Co., Ltd., Yongin-si (KR)

(72) Inventors: Taek Joon Lee, Hwaseong-si (KR); Young Gu Kim, Yongin-si (KR); Keun Chan Oh, Hwaseong-si (KR); Sun Young Chang, Bucheon-si (KR); Hye Lim Jang, Hwaseong-si (KR); Baek Kyun Jeon, Yongin-si (KR); Jin Soo Jung, Hwaseong-si (KR); Kyung Seon Tak, Hwaseong-si (KR); Jae Jin Lyu, Yongin-si (KR); Moon Jung Baek, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/349,637

(22) Filed: Jun. 16, 2021

(65) Prior Publication Data

US 2021/0311338 A1    Oct. 7, 2021

Related U.S. Application Data

(63) Continuation of application No. 16/885,771, filed on May 28, 2020, now Pat. No. 11,042,059, which is a
(Continued)

(30) Foreign Application Priority Data

Oct. 25, 2017  (KR) .......................... 10-2017-0139105
Sep. 4, 2018   (KR) .......................... 10-2018-0105588

(51) Int. Cl.
*G02F 1/13*     (2006.01)
*G02F 1/13357*  (2006.01)
(Continued)

(52) U.S. Cl.
CPC ...... *G02F 1/1336* (2013.01); *G02F 1/133512* (2013.01); *G02F 1/133514* (2013.01);
(Continued)

(58) Field of Classification Search
CPC ............ G02F 1/1336; G02F 1/133512; G02F 1/133514; G02F 1/133617;
(Continued)

(56) References Cited

U.S. PATENT DOCUMENTS

2010/0283036 A1 * 11/2010 Coe-Sullivan ...... H01L 51/5088
                                                   257/13

FOREIGN PATENT DOCUMENTS

EP    3 339 920 A1    6/2018
JP    2009-58954 A    3/2009
(Continued)

OTHER PUBLICATIONS

European Extended Search Report, for Patent Application No. EP 18202711.0, dated Mar. 13, 2019, 10 pages.

*Primary Examiner* — Anne M Hines
(74) *Attorney, Agent, or Firm* — Lewis Roca Rothgerber Christie LLP

(57) ABSTRACT

Provided are a wavelength conversion layer and a display device. A color conversion element comprises: a wavelength conversion layer; one or more low refractive layers which are disposed on and/or under the wavelength conversion layer and have a lower refractive index than the wavelength conversion layer; and one or more capping layers which are disposed between the wavelength conversion layer and the low refractive layers and/or on a surface opposite to a surface of each of the low refractive layers which faces the wavelength conversion layer.

20 Claims, 15 Drawing Sheets

Related U.S. Application Data continuation of application No. 16/143,127, filed on Sep. 26, 2018, now Pat. No. 10,678,091.

(51) Int. Cl.
  *G02F 1/1335* (2006.01)
  *H01L 51/52* (2006.01)
  *H01L 27/32* (2006.01)

(52) U.S. Cl.
  CPC ...... *G02F 1/133617* (2013.01); *H01L 27/322* (2013.01); *H01L 51/5275* (2013.01); *H01L 51/5284* (2013.01); *G02F 1/133614* (2021.01); *H01L 2251/5369* (2013.01)

(58) Field of Classification Search
  CPC ............. G02F 1/133614; H01L 27/322; H01L 51/5284; H01L 51/5275; H01L 2251/5369
  See application file for complete search history.

(56) References Cited

FOREIGN PATENT DOCUMENTS

| | | |
|---|---|---|
| JP | 2009-66965 A | 4/2009 |
| JP | 2009-108155 A | 5/2009 |
| JP | 2009-119780 A | 6/2009 |
| KR | 10-2016-0017373 A | 2/2016 |
| KR | 10-2016-0040497 A | 4/2016 |
| KR | 10-2017-0014755 A | 2/2017 |
| WO | WO 2012/161012 A1 | 11/2012 |
| WO | WO 2013/039141 A1 | 3/2013 |

\* cited by examiner

COLOR CONVERSION ELEMENT AND DISPLAY DEVICE INCLUDING THE SAME

CROSS-REFERENCE TO RELATED APPLICATIONS

This application is a continuation of U.S. application Ser. No. 16/885,771, filed on May 28, 2020, which is a continuation of U.S. application Ser. No. 16/143,127, filed on Sep. 26, 2018, now U.S. Pat. No. 10,678,091, issued on Jun. 9, 2020, which claims priority to and the benefit of Korean Patent Application No. 10-2017-0139105, filed on Oct. 25, 2017, and Korean Patent Application No. 10-2018-0105588, filed on Sep. 4, 2018, in the Korean Intellectual Property Office, the entire content of each of which is incorporated herein by reference.

BACKGROUND

1. Field

The present disclosure relates to a color conversion element and a display device including the same.

2. Description of the Related Art

A display device may include a color conversion element that receives light from a light source, such as an organic light emitting diode, and realizes a color. The color conversion element may be provided in the display device in the form of a substrate or may be integrated directly with elements within the display device. In an example, the color conversion element may receive blue light from the light source and emit blue, green and red light, so that an image having various suitable colors can be displayed. In this case, the green light and the red light may be realized by converting the received blue light, and the blue light may be realized by emitting the received blue light as it is or by scattering the received blue light to improve the viewing angle.

However, when light provided from the light source transmits through a layer containing wavelength conversion particles or a scatterer, it can be absorbed or scattered back to the light source by a filter layer without being converted into green and red light. Such light loss can reduce light efficiency, luminance, etc.

SUMMARY

Aspects of embodiments of the present disclosure provide a color conversion element capable of improving light efficiency, luminance, etc. by recycling light that is lost in the process of transmitting through a layer containing wavelength conversion particles or a scatterer, and a display device including the color conversion element.

However, aspects of embodiments of the present disclosure are not restricted to the ones set forth herein. The above and other aspects of embodiments of the present disclosure will become more apparent to one of ordinary skill in the art to which the present disclosure pertains by referencing the detailed description of provided below.

According to an aspect of an embodiment of the present disclosure, there is provided a color conversion element comprising: a wavelength conversion layer; one or more low refractive layers which are disposed on and/or under the wavelength conversion layer and have a lower refractive index than the wavelength conversion layer; and one or more capping layers which are disposed between the wavelength conversion layer and the low refractive layers and/or on a surface opposite to a surface of each of the low refractive layers which faces the wavelength conversion layer.

According to another aspect of an embodiment of the present disclosure, there is provided a display device comprising: a display element; and a color conversion element which is disposed on the display element, wherein the color conversion element comprises: a base substrate; a wavelength conversion pattern layer which is disposed on the base substrate; a first low refractive layer which is disposed between the base substrate and the wavelength conversion pattern layer and/or a second low refractive layer which is disposed on the wavelength conversion pattern layer; and one or more capping layers which are disposed on and/or under the first low refractive layer and/or the second low refractive layer, wherein each of the first low refractive layer and the second low refractive layer has a lower refractive index than the wavelength conversion pattern layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
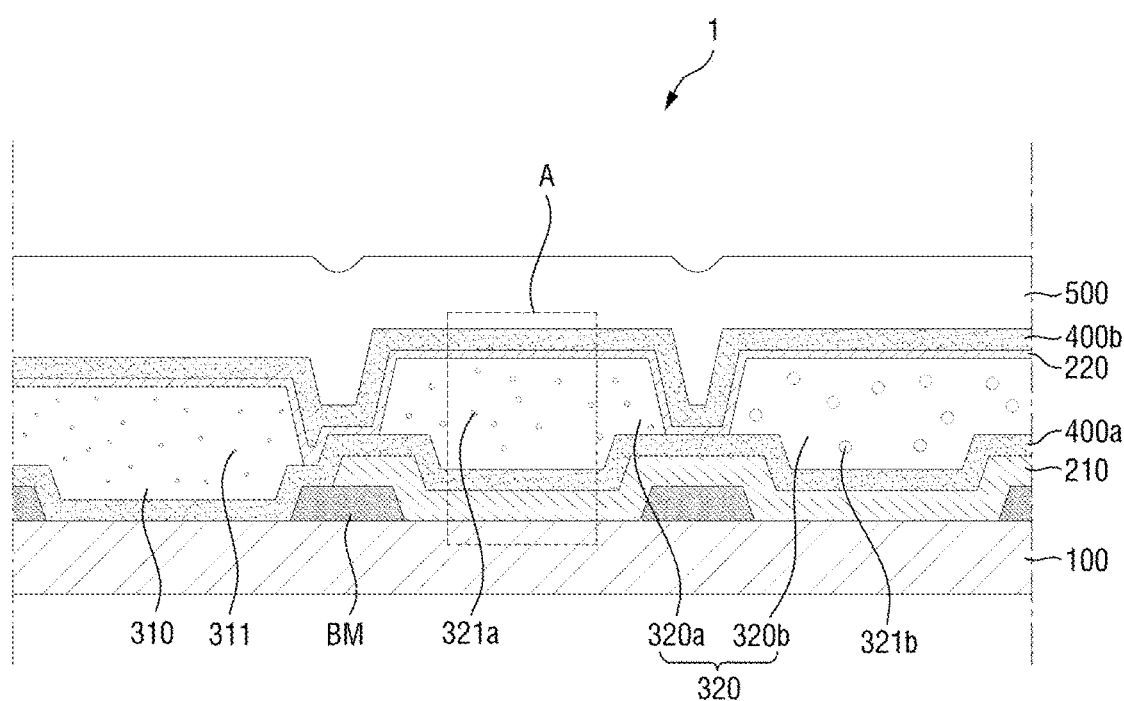
FIG. 1 is a cross-sectional view of a color conversion element according to an embodiment.

Features of embodiments of the present disclosure and methods of accomplishing the same may be understood more readily by reference to the following detailed description of embodiments and the accompanying drawings. The subject matter of the present disclosure may, however, be embodied in many different forms and should not be construed as being limited to the embodiments set forth herein. Rather, these embodiments are provided so that this disclosure will be thorough and complete and will fully convey the concepts and features of the subject matter of the present disclosure to those skilled in the art, and the invention will only be defined by the appended claims, and equivalents thereof.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the spirit and scope of the present disclosure.

The terminology used herein is for the purpose of describing the disclosed embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in the present disclosure, specify the presence of stated features, integers, operations, elements, and/or components, but do not preclude the presence or addition of one or more other features, integers, steps, operations, elements, components, and/or groups thereof. "At least one" is not to be construed as limiting "a" or "an." "Or" means "and/or." As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

Hereinafter, embodiments will be described with reference to the accompanying drawings.

Figure 2:
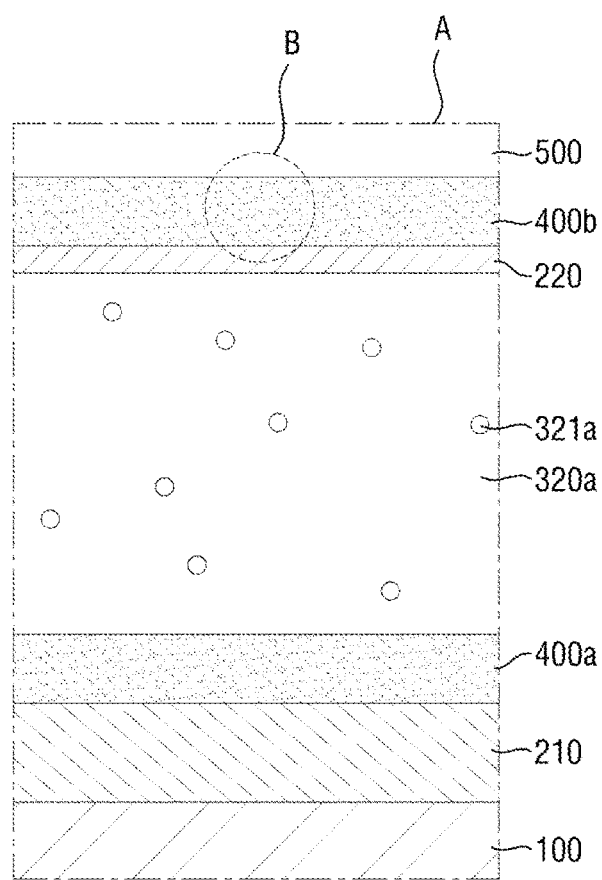
FIG. 2 is an enlarged view of a portion A of FIG. 1.

FIG. 1 is a cross-sectional view of a color conversion element 1 according to an embodiment, and FIG. 2 is an enlarged view of a portion A of FIG. 1.

Referring to FIGS. 1-2, the color conversion element 1 includes a base substrate 100, a light shielding member BM, wavelength conversion pattern layers 320, a light-transmitting pattern layer 310, and a plurality of low refractive layers 400a and 400b. In addition, the color conversion element 1 may further include a first wavelength band filter layer 210, a second wavelength band filter layer 220, and an overcoat layer 500.

The base substrate 100 may support components of the color conversion element 1 by providing a space for accommodating the wavelength conversion pattern layers 320, the low refractive layers 400a and 400b, etc. located on the base substrate 100. The base substrate 100 may be a light transmitting substrate. In an embodiment, when the color conversion element 1 is coupled to a display element 10, an upper part of the color conversion element 1 based on FIG. 1 may be placed to face the display element 10 and then bonded to the display element 10 (see FIG. 4). In this case, light provided from the display element 10 may be transmitted through the base substrate 100 from an upper surface of the base substrate 100 toward a lower surface of the base substrate 100 based on FIG. 1.

The light shielding member BM is disposed on the base substrate 100. An area where the light shielding member BM is disposed in a plan view may be an area where the transmission of visible light is substantially blocked, and an area where the light shielding member BM is not disposed may be a light transmitting area. In an embodiment, the light shielding member BM may include an organic material including a blue colorant, and the organic material may include a photosensitive organic material.

The light shielding member BM may be disposed in a predetermined (or set) pattern. For example, the light shielding member BM may be disposed between adjacent ones of the wavelength conversion pattern layers 320 and the light-transmitting pattern layer 310 located on the light shielding member BM.

The light shielding member BM may include a material having a high absorption rate for visible light. In an embodiment, the light shielding member BM may include a metal such as chrome, a metal nitride, a metal oxide, or a resin material colored in black.

The light shielding member BM can improve color reproducibility by preventing color mixing between adjacent ones of the wavelength conversion pattern layers 320 and the light-transmitting pattern layer 310 (or by reducing a likelihood or amount of such color mixing).

The wavelength conversion pattern layers 320 and the light-transmitting pattern layer 310 may be disposed on the base substrate 100 in the area where the light shielding member BM is not disposed. However, embodiments are not limited to this case, and a portion of the wavelength conversion pattern layers 320 and/or the light-transmitting pattern layer 310 can also be disposed on the light shielding member BM to overlap at least a portion of the light shielding member BM. In addition, the wavelength conversion pattern layers 320 and the light-transmitting pattern layer 310 may be, but not necessarily, spaced apart from each other by a predetermined (or set) distance.

The wavelength conversion pattern layers 320 may include a first wavelength conversion pattern layer 320a and a second wavelength conversion pattern layer 320b. The first wavelength conversion pattern layer 320a, the second wavelength conversion pattern layer 320b, and the light-transmitting pattern layer 310 may be arranged on the base substrate 100 in a predetermined (or set) order or rule. For example, the first wavelength conversion pattern layer 320a, the second wavelength conversion pattern layer 320b, and the light-transmitting pattern layer 310 may be arranged in a specific (or set) pattern in a plan view. In the drawings, the light-transmitting pattern layer 310, the first wavelength conversion pattern layer 320a and the second wavelength conversion pattern layer 320b are arranged sequentially in this order. However, the arrangement order or rule of the light-transmitting pattern layer 310, the first wavelength conversion pattern layer 320a and the second wavelength conversion pattern layer 320b is not limited to this example.

The first wavelength conversion pattern layer 320a may receive light and emit light having a first color. For example, the first wavelength conversion pattern layer 320a may receive light having a wavelength band of a third color from a light source and convert the received light into light having a wavelength band of the first color.

In an embodiment, the first color may be green having a wavelength band of about 495 to 570 nm. However, it should be understood that the wavelength band of green includes all wavelength ranges that can be recognized as green in the art.

The second wavelength conversion pattern layer 320b may receive light and emit light having a second color. For example, the second wavelength conversion pattern layer 320b may receive light having the wavelength band of the third color from the light source and convert the received light into light having a wavelength band of the second color.

In an embodiment, the second color may be red having a wavelength band of about 620 to 750 nm. However, it should be understood that the wavelength band of red includes all wavelength ranges that can be recognized as red in the art.

The first wavelength conversion pattern layer 320a and the second wavelength conversion pattern layer 320b may respectively include first and second wavelength conversion particles 321a and 321b to convert the wavelength of received light. The first and second wavelength converting particles 321a and 321b may include, for example, quantum dots, fluorescent particles, or phosphorescent particles.

In an embodiment, the first wavelength conversion pattern layer 320a may include the first wavelength conversion particles 321a that convert light of the third color received from the light source into light having the first color, and the second wavelength conversion pattern layer 320b may include the second wavelength conversion particles 321b that convert the light of the third color received from the light source into light having the second color.

The quantum dots, which are an example of the wavelength conversion particles, are a material having a crystal structure of several nanometers in size. The quantum dots are composed of several hundreds to thousands of atoms and exhibit a quantum confinement effect in which an energy band gap increases due to the small size of the quantum dots. When light of a wavelength having a higher energy than a band gap is incident on the quantum dots, the quantum dots are excited by absorbing the light and fall to a ground state while emitting light of a specific (or set) wavelength. The emitted light of the specific (or set) wavelength has a value corresponding to the band gap. Emission characteristics due to the quantum confinement effect can be adjusted by controlling the size and composition of the quantum dots.

The quantum dots may include at least one of a group II-VI compound, a group II-V compound, a group III-VI compound, a group III-V compound, a group IV-VI compound, a group compound, a group II-IV-VI compound, and/or a group II-IV-V compound.

A quantum dot may include a core and a shell overcoating the core. The core may be, but is not limited to, at least one of CdS, CdSe, CdTe, ZnS, ZnSe, ZnTe, GaN, GaP, GaAs, GaSb, AlN, AlP, AlAs, AlSb, InP, InGaP, InAs, InSb, SiC, Ca, Se, In, P, Fe, Pt, Ni, Co, Al, Ag, Au, Cu, FePt, $Fe_2O_3$, $Fe_3O_4$, Si, and Ge. The shell may include, but is not limited to, at least one of ZnS, ZnSe, ZnTe, ZnSeS, ZnTeS, CdS, CdSe, CdTe, HgS, HgSe, HgTe, AlN, AlP, AlAs, AlSb, GaN, GaP, GaAs, GaSb, GaSe, InN, InP, InAs, InSb, TIN, TIP, TIAs, TISb, PbS, PbSe, and/or PbTe.

When light incident on the wavelength conversion particles is emitted after its wavelength is converted by the wavelength conversion particles, the emission direction of the light has random scattering characteristics (Lambertian emission). Therefore, even if the wavelength conversion pattern layers 320 having the wavelength conversion particles do not include a scatterer, the front and side luminance of light emitted from the wavelength conversion pattern layers 320 may be uniform or substantially uniform. However, the wavelength conversion pattern layers 320 may further include the scatterer in order to increase light conversion efficiency. The scatterer may be, but is not limited to, the same or substantially the same as a scatterer 311 included in the light-transmitting pattern layer 310 which will be described elsewhere herein.

The light-transmitting pattern layer 310 may receive light and emit light of the third color. For example, the light-transmitting pattern layer 310 may receive light having the wavelength band of the third color from the light source and transmit the received light.

In an embodiment, the third color may be blue having a wavelength band of about 450 to 495 nm. However, it should be understood that the wavelength band of blue includes all wavelength ranges that can be recognized as blue in the art.

The light-transmitting pattern layer 310 may be made of a transparent organic layer in order to transmit light received from the light source as it is. In some embodiments, the light-transmitting pattern layer 310 may include a colorant having the third color. For example, the colorant may be a pigment, a dye, or a mixture thereof. The colorant may be dispersed in the transparent organic layer of the light-transmitting pattern layer 310. Since the light-transmitting pattern layer 310 includes the colorant having the third color, the purity of the third color of light emitted from the light-transmitting pattern layer 310 can be increased. However, embodiments are not limited to this case, and the light-transmitting pattern layer 310 can also be made of an organic layer having a color that transmits only the wavelength of the third color.

The light-transmitting pattern layer 310 may further include the scatterer 311. The scatterer 311 may be dispersed in the light-transmitting pattern layer 310. The scatterer 311 scatters light incident on the light-transmitting pattern layer 310 to make light emitted from the light-transmitting pattern layer 310 have uniform or substantially uniform front and side luminance, thereby improving the viewing angle of a display device including the color conversion element 1. The scatterer 311 may be any suitable material that can uniformly or substantially uniformly scatter light. For example, the scatterer 311 may be nanoparticles such as $SiO_2$, $TiO_2$, $ZrO_2$, $Al_2O_3$, $In_2O_3$, ZnO, $SnO_2$, $Sb_2O_3$ and/or ITO.

The low refractive layers 400a and 400b may be disposed on and under the wavelength conversion pattern layers 320 and the light-transmitting pattern layer 310. The low refractive layers 400a and 400b include the first low refractive layer 400a and the second low refractive layer 400b disposed on and under the wavelength conversion pattern layers 320 and the light-transmitting pattern layer 310, respectively. For example, the low refractive layers 400a and 400b may cover upper and lower surfaces of the wavelength conversion pattern layers 320 and the light-transmitting pattern layer 310.

The low refractive layers 400a and 400b may also be disposed on at least part of side surfaces of the wavelength conversion pattern layers 320 and the light-transmitting pattern layer 310. For example, as illustrated in the drawings, the second low refractive layer 400b may cover not only the upper surfaces but also the side surfaces of the wavelength conversion pattern layers 320 and the light-transmitting pattern layer 310.

The first low refractive layer 400a may be disposed as a single integrated layer under the first and second wavelength conversion pattern layers 320a and 320b and the light-transmitting pattern layer 310. However, embodiments are not limited to this case, and the first low refractive layer 400a may also be composed of separate layers disposed under the wavelength conversion pattern layers 320 and the light-transmitting pattern layer 310, respectively. In this case, the first low refractive layer 400a may also not be disposed under some of the first and second wavelength conversion pattern layers 320a and 320b and the light-transmitting pattern layer 310. The second low refractive layer 400b may also be the same or substantially the same as the first low refractive layer 400a.

The low refractive layers 400a and 400b may have a lower refractive index than the wavelength conversion pattern layers 320 and the light-transmitting pattern layer 310. The low refractive layers 400a and 400b may induce the total reflection of light coming from the light conversion pattern layers 320 or the light-transmitting pattern layer 310 in order to recycle the light.

For example, the first low refractive layer 400a may reflect light, which transmits through the wavelength conversion pattern layers 320 without passing through the wavelength conversion particles 321a and 321b, in an upward direction so that the light can be incident on the wavelength conversion particles 321a and 321b, and the second low refractive layer 400b may reflect light, which is scattered in the upward direction by the wavelength conversion particles 321a and 321b, in a downward direction to recycle the light. In addition, a portion of the second low refractive layer 400b which is disposed on the side surfaces of the wavelength conversion pattern layers 320 and the light-transmitting pattern layer 310 may play some or all of the above roles. Since light can be recycled due to the low refractive layers 400a and 400b disposed on at least one surface of the wavelength conversion pattern layers 320 and the light-transmitting pattern layer 310, the light efficiency of the color conversion element 1 can be improved.

The refractive index of each of the low refractive layers 400a and 400b may be 1.3 or less. When the refractive index of each of the low refractive layers 400a and 400b is 1.3 or less, the difference in refractive index between the low refractive layers 400a and 400b and the wavelength conversion pattern layers 320 or the light-transmitting pattern layer 310 is large. Therefore, the total reflection of light can certainly occur.

Embodiments of each low refractive layer 400a or 400b will now be described in detail.

Figure 3:
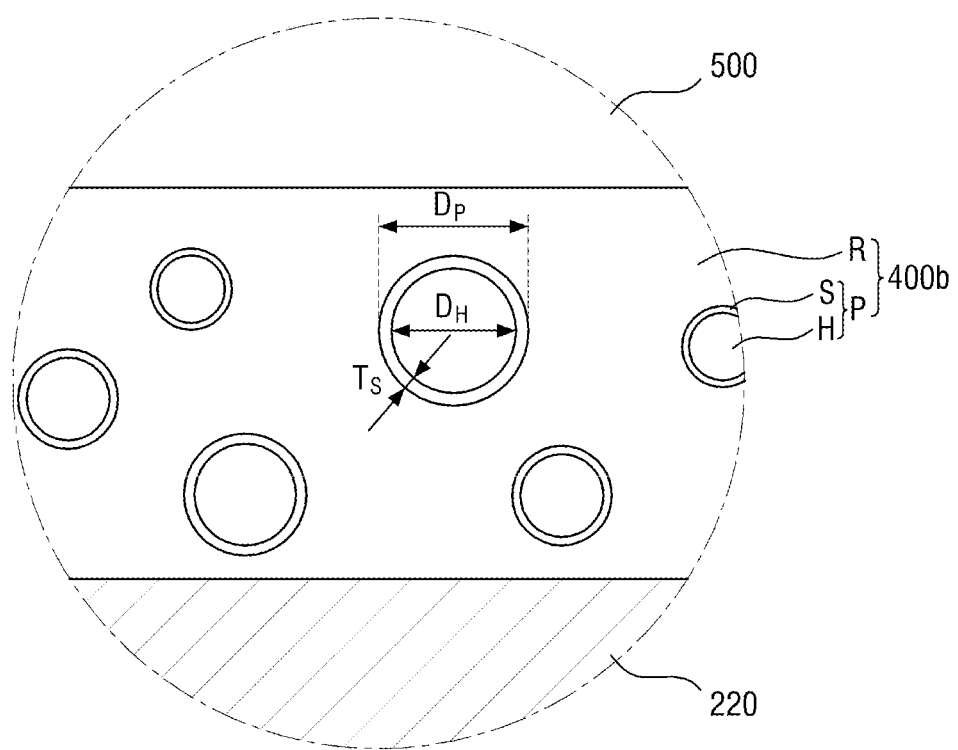
FIG. 3 is an enlarged view of a portion B of FIG. 2.

FIG. 3 is an enlarged view of a portion B of FIG. 2.

Referring to FIG. 3, each of the low refractive layers 400a and 400b may include inorganic particles P, each having a hole H, and a resin R. The inorganic particles P may be dispersed in the resin R.

The inorganic particles P may include one or more of silica ($SiO_2$), magnesium fluoride ($MgF_2$), and/or iron oxide ($Fe_3O_4$). For example, the inorganic particles P may each include a shell S made of one or more selected from the above materials and the hole H defined in the shell S and surrounded by the shell S.

In an embodiment, the inorganic particles P may have a diameter DP of 20 to 200 nm, and the shell S may have a thickness Ts of 5 to 20 nm. A diameter DH of the hole H may be determined by the diameter DP of the inorganic particles P and the thickness Ts of the shell S. When the diameter DP of the inorganic particles P and the thickness Ts of the shell S are within the above ranges, the refractive indices of the low refractive layers 400a and 400b may have relatively lower values than the refractive indices of the wavelength conversion pattern layers 320 and the light-transmitting pattern layer 310.

The resin R may include one or more of acryl, polysiloxane, fluorinated-polysiloxane, polyurethane, fluorinated-polyurethane, polyurethane-acrylate, fluorinated-polyurethane-acrylate, cardo binder, polyimide, polymethylsilsesquioxane (PMSSQ), poly(methyl methacrylate) (PMMA), and/or a PMSSQ-PMMA hybrid.

The weight ratio of the inorganic particles P and the resin R contained in each of the low refractive layers 400a and 400b may be 1.5 to 4:1. When the weight ratio of the inorganic particles P to the resin R is 1.5:1 or more, the low refractive layers 400a and 400b may have a sufficiently low refractive index of 1.3 or less. Therefore, the low refractive layers 400a and 400b can efficiently induce the total reflection of light. When the weight ratio of the inorganic particles P to the resin R is 4:1 or less, a reduction in the adhesion and/or chemical resistance of the low refractive layers 400a and 400b to adjacent layers can be prevented (or a likelihood or amount of such reduction in adhesion and/or chemical resistance may be reduced).

Each of the low refractive layers 400a and 400b may be formed by coating, baking and/or photocuring a solution that contains the inorganic particles P, the resin R, a solvent, a photoreactor, and additives. The solvent, photoreactor and additives contained in the solution may be removed by evaporation or reaction during the baking/curing process.

Referring back to FIGS. 1-2, the first wavelength band filter layer 210 may be disposed under the wavelength conversion pattern layers 320. For example, the first wavelength band filter layer 210 may be disposed between the base substrate 100 and the first low refractive layer 400a.

The first wavelength band filter layer 210 may absorb or reflect light of the third color. For example, the first wavelength band filter layer 210 may be a color filter or a wavelength-selective optical filter that absorbs or reflects light having the wavelength band of the third color received from the light source and transmits light having a longer wavelength than the third color, for example, light of the first color and/or the second color.

As described above, the upper part of the color conversion element 1 based on FIG. 1 may be placed to face the display element 10 and then bonded to the display element 10. In this case, light emitted from the display element 10 may first enter the wavelength conversion pattern layers 320 and may be converted into a wavelength of the first color or the second color. Then, the light may be incident on the first wavelength band filter layer 210. Here, a portion of the light of the third color which is incident on the wavelength conversion pattern layers 320 may transmit through the wavelength conversion pattern layers 320 without passing through the wavelength conversion particles 321a and 321b. The first wavelength band filter layer 210 may block this portion of the light of the third color, thereby improving the purity of the first color and/or the second color of light output from the wavelength conversion pattern layers 320.

In an embodiment, the first wavelength band filter layer 210 may be a third color filter layer. The first wavelength band filter layer 210 may be made of, but not limited to, an organic layer having a yellow color.

The first wavelength band filter layer 210 may be disposed only under the first wavelength conversion pattern layer 320a and the second wavelength conversion pattern layer 320b and may not be disposed under the light-transmitting pattern layer 310. In some embodiments, a filter layer may not be disposed under the light-transmitting pattern layer 310. In some other embodiments, a color filter that transmits light of the third color and blocks light of the first color and blocks light of the second color, for example, a blue color filter may be located under the light-transmitting pattern layer 310. The first wavelength band filter layer 210 may be disposed as a single integrated layer under the wavelength conversion pattern layers 320. However, as in an embodiment to be described later, the first wavelength band filter layer 210 may also be disposed as separate layers under the first wavelength conversion pattern layer 320a and the second wavelength conversion pattern layer 320b, respectively. For example, a color filter that transmits light of the first color (for example, a green color filter) may be disposed to correspond to the first wavelength conversion pattern layer 320a, and a color filter that transmits light of the second color (for example, a red color filter) may be disposed to correspond to the second wavelength conversion pattern layer 320b.

The second wavelength band filter layer 220 may be disposed on the wavelength conversion pattern layers 320. For example, the second wavelength band filter layer 220 may be disposed between the wavelength conversion pattern layers 320 and the second low refractive layer 400b. In an embodiment, the second wavelength band filter layer 220 may be omitted. A case where the second wavelength band filter layer 220 is provided will be hereinafter described as an example, but embodiments are not limited to this case.

The second wavelength band filter layer 220 may reflect light of the first and second colors. For example, the second wavelength band filter layer 220 may be a color filter or a wavelength-selective optical filter that transmits light of the third color and reflects light having a longer wavelength than the third color, for example, light of the first and second colors.

As described above, the upper part of the color conversion element 1 based on FIG. 1 may be placed to face the display element 10 and then bonded to the display element 10. In this case, a portion of light converted into the wavelength of the first or second color by the wavelength conversion particles 321a or 321b may be scattered in the direction of the second wavelength band filter layer 220. Here, the second wavelength band filter layer 220 may reflect the light of the first and second colors in a light output direction (i.e., the downward direction in FIG. 1) of the color conversion element 1, thereby improving the luminance and efficiency of the light of the first and second colors of the color conversion element 1.

However, since the second low refractive layer 400b disposed on the wavelength conversion pattern layers 320 can also reflect light, which is scattered in the upward direction by the wavelength conversion particles 321a and 321b, in the downward direction, the second wavelength band filter layer 220 can be omitted when the second low refractive layer 400b is provided, as in an embodiment to be described elsewhere herein.

The second wavelength band filter layer 220 may include one or more layers made of an inorganic material. The inorganic material may be one or more of silicon oxide ($SiO_x$), silicon nitride ($SiN_x$) and/or silicon oxynitride ($SiO_xN_y$).

In an embodiment, the second wavelength band filter layer 220 may include a plurality of low refractive layers and a plurality of high refractive layers stacked alternately. The low refractive layers of the second wavelength band filter layer 220 may be layers having a relatively low refractive index as compared with adjacent layers, and the high refractive index layers may be layers having a relatively high refractive index as compared with adjacent layers. The transmission wavelength band and the reflection wavelength band of the second wavelength band filter layer 220 can be controlled by, but not limited to, the materials of the low refractive layers and the high refractive layers, the difference between the respective thicknesses of the low refractive layers and the high refractive layers and the difference between the respective refractive indices of the low refractive layers and the high refractive layers.

In some embodiments, the second wavelength band filter layer 220 may include a silicon nitride layer and a silicon oxide layer stacked alternately. In an embodiment, the low refractive layers may be made of a silicon oxide, and the high refractive layers may be made of a metal oxide such as titanium oxide ($TiO_x$), tantalum oxide ($TaO_x$), hafnium oxide ($HfO_x$), or zirconium oxide ($ZrO_x$). However, the structure of the second wavelength band filter layer 220 is not limited to this example.

The second wavelength band filter layer 220 may be disposed as a single integrated layer on the wavelength conversion pattern layers 320 and the light-transmitting pattern layer 310. However, embodiments are not limited to this case, and the second wavelength band filter layer 220 may also be disposed only on the wavelength conversion pattern layers 320 or may be disposed as separate layers on the first and second wavelength conversion pattern layers 320a and 320b and the light-transmitting pattern layer 310, respectively.

The overcoat layer 500 may be disposed on the second low refractive layer 400b. The overcoat layer 500 may be a planarization layer that can minimize or reduce a step formed by the lamination of a plurality of layers, such as the wavelength conversion pattern layers 320 and the low refractive layers 400a and 400b, on the base substrate 100. The overcoat layer 500 may cover all of the layers disposed on the base substrate 100 without distinction between the wavelength conversion pattern layers 320 and the light-transmitting pattern layer 310.

The overcoat layer 500 may be made of an organic material having planarization properties. For example, the overcoat layer 500 may be made of thermosetting resin. The overcoat layer 500 may be made of an organic material including one or more of cardo resin, polyimide resin, acrylic resin, siloxane resin, and/or silsesquioxane resin.

Figure 4:
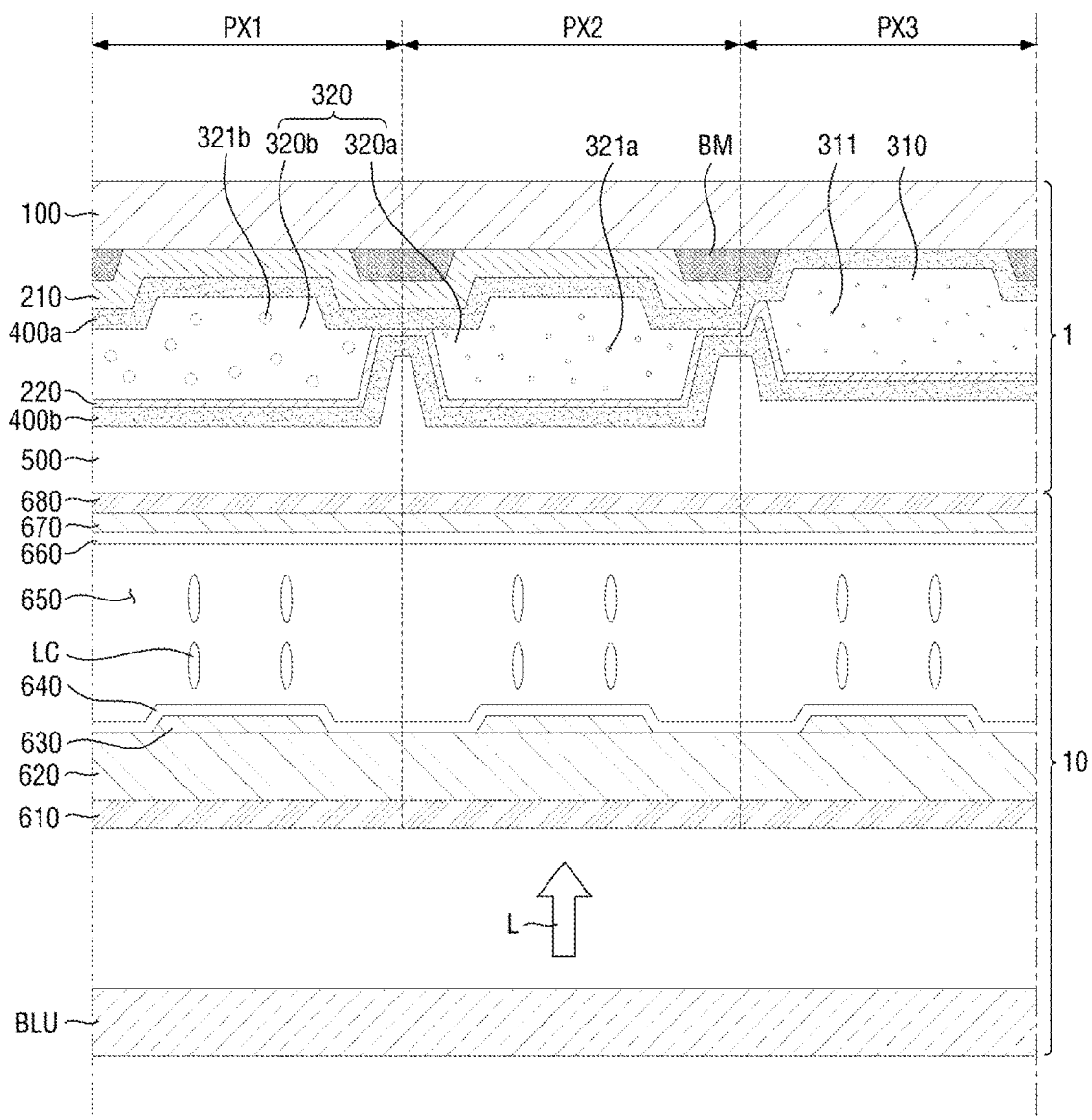
FIG. 4 is a cross-sectional view of a display device according to an embodiment.

FIG. 4 is a cross-sectional view of a display device according to an embodiment.

Referring to FIG. 4, the display device includes a display element 10 and a color conversion element 1 placed to face the display element 10. The color conversion element 1 may be disposed on the display element 10, and the base substrate side of the color conversion element 1 may be placed to face upward based on FIG. 4.

A plurality of pixels PX1 through PX3 may be defined in the display device and arranged substantially in a matrix form in a plan view. As used herein, 'pixels' refer to single regions into which a display area is divided for color display in a plan view, and one pixel may be a minimum unit that can express a color independently of other pixels. For example, each of the pixels PX1 through PX3 may uniquely display one of the primary colors to implement color display. For example, the pixels PX1 through PX3 may include a third pixel PX3 which displays the third color, a second pixel PX2 which displays the first color having a longer peak wavelength than the third color, and a first pixel PX1 which displays the second color having a longer peak wavelength than the first color.

The first pixel PX1, the second pixel PX2 and the third pixel PX3 arranged adjacent to each other may form a basic unit, and the basic unit may be repeated. A case where the first color is green, the second color is red and the third color is blue will be hereinafter described as an example, but embodiments are not limited to this case.

A light-transmitting pattern layer 310, a first wavelength conversion pattern layer 320a and a second wavelength conversion pattern layer 320b may be disposed in areas correspond to the third pixel PX3, the second pixel PX2 and the first pixel PX1, respectively. However, this is merely an example, and the matching relationship between the pattern layers 310, 320a and 320b and the pixels PX1, PX2 and PX3 can be changed.

Since the color conversion element 1 has been described above, the display element 10 will be described below.

The display element 10 may include a backlight unit BLU, a lower substrate 620, a pixel electrode 630, a liquid crystal layer 650, a common electrode 670, a lower alignment layer 640, an upper alignment layer 660, a lower polarizer 610 and an upper polarizer 680.

The backlight unit BLU may be disposed under the display element 10 to provide light having a specific (or set) wavelength to the display element 10. The backlight unit BLU may include a light source which directly emits light and a light guide plate which guides the light emitted from the light source toward the display element 10.

The light source may be a light emitting diode (LED) or an organic light emitting diode (OLED). In an embodiment, the light source may emit light having a shorter peak wavelength than the first color and the second color. In an embodiment, the light source may emit light of the third color. The third color may be blue having a single peak wavelength in the range of about 430 to 470 nm. For example, the backlight unit BLU can provide light of the third color to the display element 10. In an embodiment, the light source may emit light having a peak wavelength in an ultraviolet band, and the backlight unit BLU may provide the ultraviolet light to the display element 10.

The lower substrate 620 may be disposed above the backlight unit BLU. The lower substrate 620 may include a switching element, a driving element, etc. which constitute a thin-film transistor, and a plurality of insulating layers. For example, the lower substrate 620 may be a thin-film transistor substrate.

The pixel electrode 630 may be disposed on the lower substrate 620 in each of the pixels PX1 through PX3. The common electrode 670 may be disposed on the pixel electrode 630 without distinction between the pixels PX1 through PX3. The liquid crystal layer 650 may include liquid crystals LC and may be interposed between the pixel electrode 630 and the common electrode 670. The liquid crystals LC may have negative dielectric anisotropy and may be vertically aligned in an initial alignment state.

When an electric field is formed between the pixel electrode 630 and the common electrode 670, the liquid crystals LC may be tilted or rotated in a specific (or set) direction to change the polarization state of light transmitted through the liquid crystal layer 650. In an embodiment, the liquid crystals LC may have positive dielectric anisotropy and may be horizontally aligned in the initial alignment state.

The lower alignment layer 640 may be disposed between the pixel electrode 630 and the liquid crystal layer 650, and the upper alignment layer 660 may be disposed between the common electrode 670 and the liquid crystal layer 650. The lower alignment layer 640 and the upper alignment layer 660 may induce the liquid crystals LC to have a predetermined (or set) pretilt angle in the initial alignment state.

The lower polarizer 610 may be disposed between the backlight unit BLU and the lower substrate 620, and the upper polarizer 680 may be disposed between the common electrode 670 and the color converting element 1. The lower and upper polarizers 610 and 680 may be absorptive polarizer or reflective polarizers. For example, an absorptive polarizer may absorb a polarization component parallel (e.g., substantially parallel) to an absorption axis and transmit a polarization component parallel (e.g., substantially parallel) to a transmission axis, thereby polarizing transmitted light. The lower and upper polarizers 610 and 680 may perform an optical shutter function together with the liquid crystal layer 650 to control the amount of light transmitted through each of the pixels PX1 through PX3.

The arrangement of the lower and upper polarizers 610 and 680 is not limited to that illustrated in FIG. 4, and the lower polarizer 610 can be disposed between the lower substrate 620 and the liquid crystal layer 650, and the upper polarizer 680 can be disposed between the common electrode 670 and the liquid crystal layer 650.

As described above, the display element 10 may be a liquid crystal display element that can display an image by controlling transmitted light through the control of the liquid crystal layer 650, and the light source which provides light to the color conversion element 1 located above the light source may be the backlight unit BLU of the liquid crystal display element.

However, the display element 10 of the present disclosure is not limited to the liquid crystal display element. The display element 10 may also be an organic light-emitting display element (see FIG. 13) including an organic light emitting material. The organic light-emitting display element may have a structure in which a light emitting layer is disposed in each pixel. Here, the structure in which the light emitting layer is disposed in each pixel may include a structure in which the light emitting layer is disposed in an island shape in each pixel, and/or may include a structure in which the light emitting layer is continuously disposed in each pixel such as, for example, a structure in which the light emitting layer is disposed over all the pixels. In this case, the light source of the organic light-emitting display element may be the light emitting layer, and the light emitting layer may provide light to the color conversion element 1 located above the light emitting layer. The light emitting layer may be, but is not limited to, a single layer or a multilayer that emits blue light. In addition, unlike in the above-described case where the color conversion element 1 is manufactured in the form of a separate panel and then bonded to the liquid crystal display element 10 to face the liquid crystal display element 10, the color conversion element 1 can be formed directly on the organic light-emitting display element. This will be described in detail later with reference to FIG. 13.

Light emitted from the light source of the display element 10 is output from the display element 10 via the backlight unit BLU, the liquid crystal layer 650, etc. to be incident on the color conversion element 1. Then, the incident light sequentially passes through an overcoat layer 500, a second low refractive layer 400b, a second wavelength band filter layer 220, wavelength conversion pattern layers 320 or a light-transmitting pattern layer 310, a first low refractive layer 400a, a first wavelength band filter layer 210 and a base substrate 100 of the color conversion element 1 to come out of the display device. In this process, light which transmits through the wavelength conversion pattern layers 320 without passing through wavelength conversion particles 321a and 321b or light which is scattered back toward the display element 10 by the wavelength conversion particles 321a and 321b or a scatterer 311 may be recycled by the low refractive layers 400a and 400b. Thus, the light efficiency, luminance, etc. of the display device can be improved.

Figure 5:
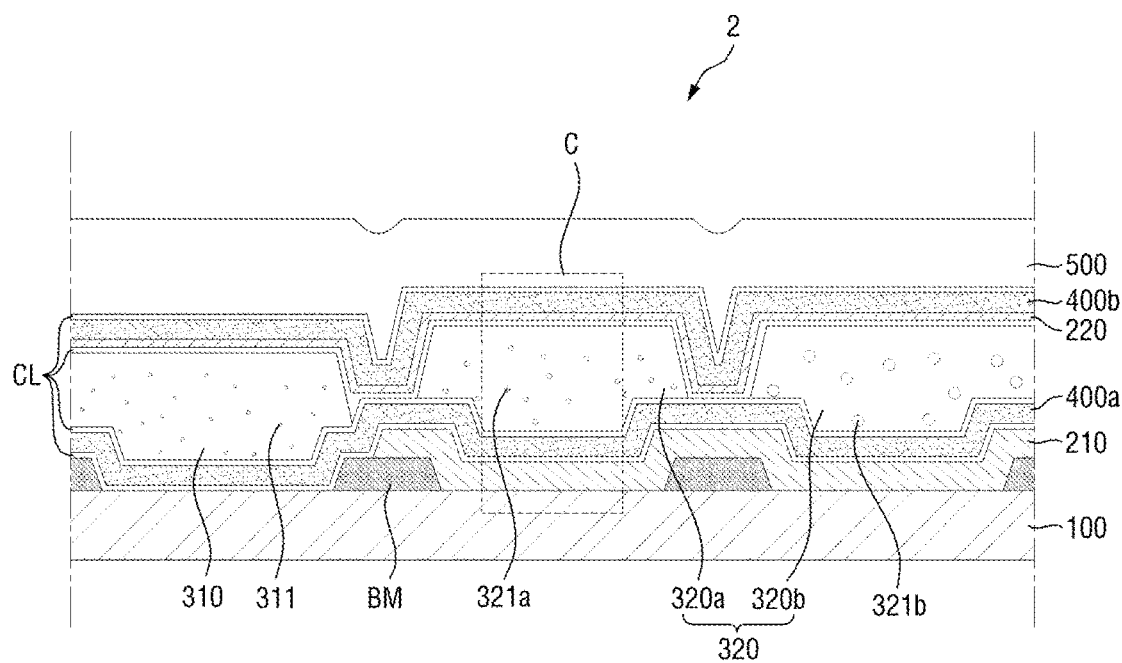
FIG. 5 is a cross-sectional view of a color conversion element according to an embodiment.
Figure 6:
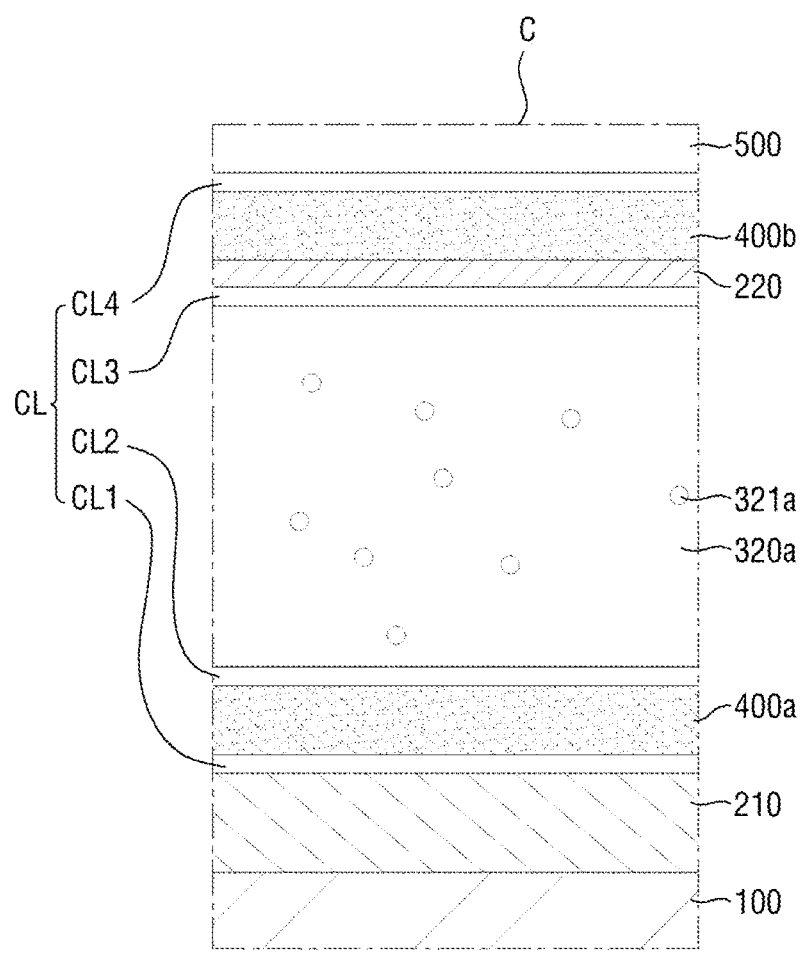
FIG. 6 is an enlarged view of a portion C of FIG. 5.

FIG. 5 is a cross-sectional view of a color conversion element 2 according to an embodiment, and FIG. 6 is an enlarged view of a portion C of FIG. 5.

The color conversion element 2 of FIGS. 5-6 is substantially the same as the color conversion element 1 described above with reference to FIGS. 1-3, except that it further includes a plurality of capping layers CL disposed on and under each low refractive layer 400a or 400b. Hereinafter, any redundant description will not be repeated, and the current embodiment will be described, focusing mainly on differences with the pervious embodiment.

Referring to FIGS. 5-6, the capping layers CL may be disposed on and under each low refractive layer 400a or 400b. A first capping layer CL1 and a second capping layer CL2 may be disposed under and on a first low refractive layer 400a, respectively, and a third capping layer CL3 and a fourth capping layer CL4 may be disposed under and on a second refractive layer 400b, respectively.

Each of the capping layers CL may be disposed directly on a low refractive layer 400a or 400b to be in contact with the low refractive layer 400a or 400b. However, embodiments are not limited to this case. For example, the third capping layer CL3 may be spaced apart from the second low refractive layer 400b with a second wavelength band filter layer 220 interposed between them. When the second wavelength band filter layer 220 includes one or more layers made of an inorganic material as described above, it can also play the role of protecting the second low refractive layer 400b, and the third capping layer CL3 can be omitted as in an embodiment to be described elsewhere herein.

Each capping layer CL may be made of an inorganic material. For example, each capping layer CL may include one or more of silicon oxide ($SiO_x$), silicon nitride ($SiN_x$), and/or silicon oxynitride ($SiO_xN_y$).

The low refractive layers 400a and 400b can be damaged in a subsequent process by a solvent or developer introduced by adjacent organic material layers or can be damaged by outgas due to baking. Accordingly, the refractive indices of the low refractive layers 400a and 400b may increase, which, in turn, degrades the function of totally reflecting light. For example, since wavelength conversion pattern layers 320, a first wavelength band filter layer 210 and an overcoat layer 500 can be made of an organic material, the function of the low refractive layers 400a and 400b adjacent to the wavelength conversion pattern layers 320, the first wavelength band filter layer 210 and the overcoat layer 500 can be degraded.

However, the capping layers CL made of an inorganic material physically separate and protect each of the low refractive layers 400a and 400b from adjacent organic material layers, thereby preventing an increase in the refractive indices of the low refractive layers 400a and 400b (or thereby reducing the likelihood or amount of such an increase in the refractive indices).

Figure 7:
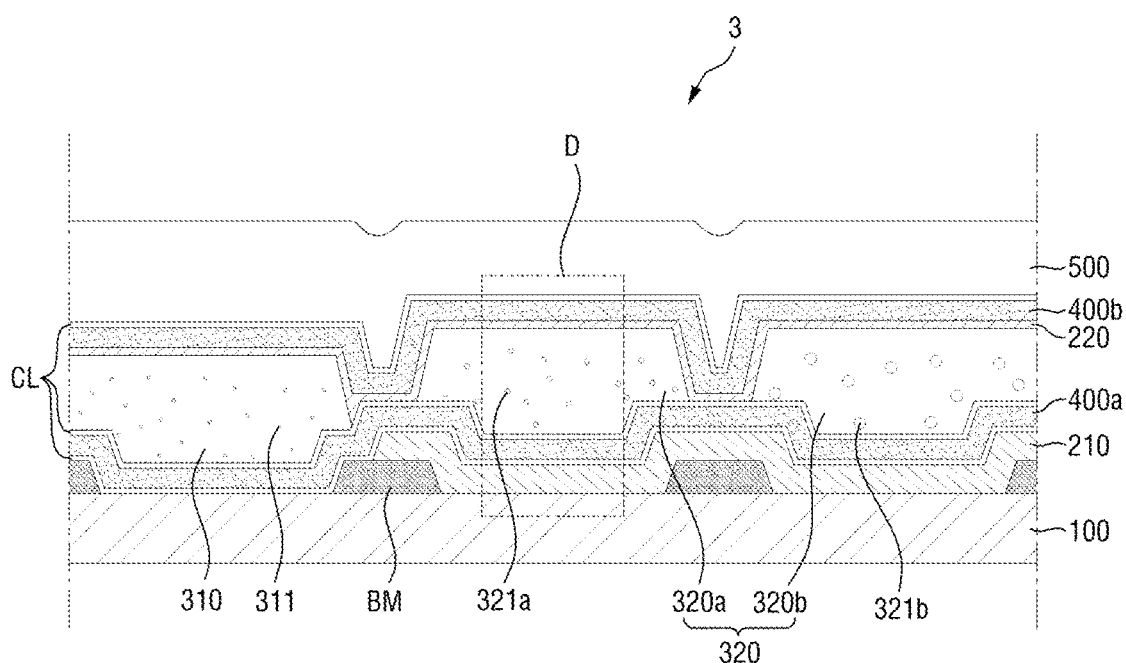
FIG. 7 is a cross-sectional view of a color conversion element according to an embodiment.
Figure 8:
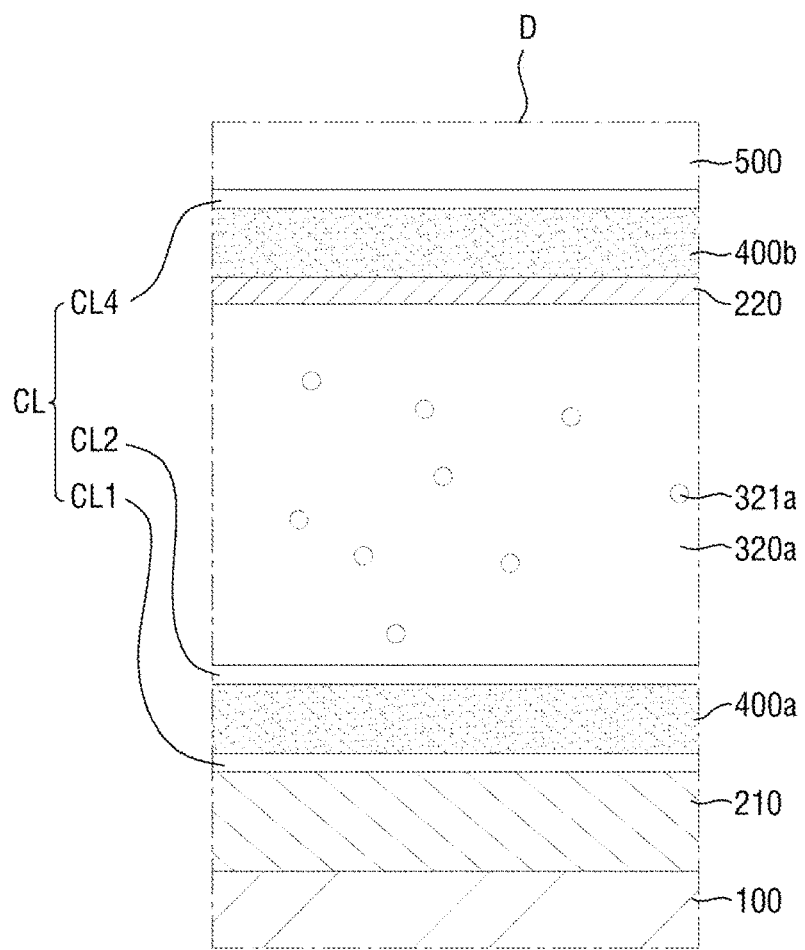
FIG. 8 is an enlarged view of a portion D of FIG. 7.

FIG. 7 is a cross-sectional view of a color conversion element 3 according to an embodiment, and FIG. 8 is an enlarged view of a portion D of FIG. 7.

The color conversion element 3 of FIGS. 7-8 is substantially the same as the color conversion element 2 described above with reference to FIGS. 5-6, except that a third capping layer CL is omitted. Hereinafter, any redundant description will not be repeated, and the current embodiment will be described, focusing mainly on differences with the pervious embodiment.

Referring to FIGS. 7-8, the third capping layer CL3 disposed under a second low refractive layer 400b, for example, between the second low refractive layer 400b and wavelength conversion pattern layers 320 may be omitted. In this case, a second wavelength band filter layer 220 may include one or more layers made of an inorganic material as described above and may play the role of protecting the second low refractive layer 400b. In addition, the second wavelength band filter layer 220 may be formed as a single layer containing one or more of the above example inorganic materials.

Figure 9:
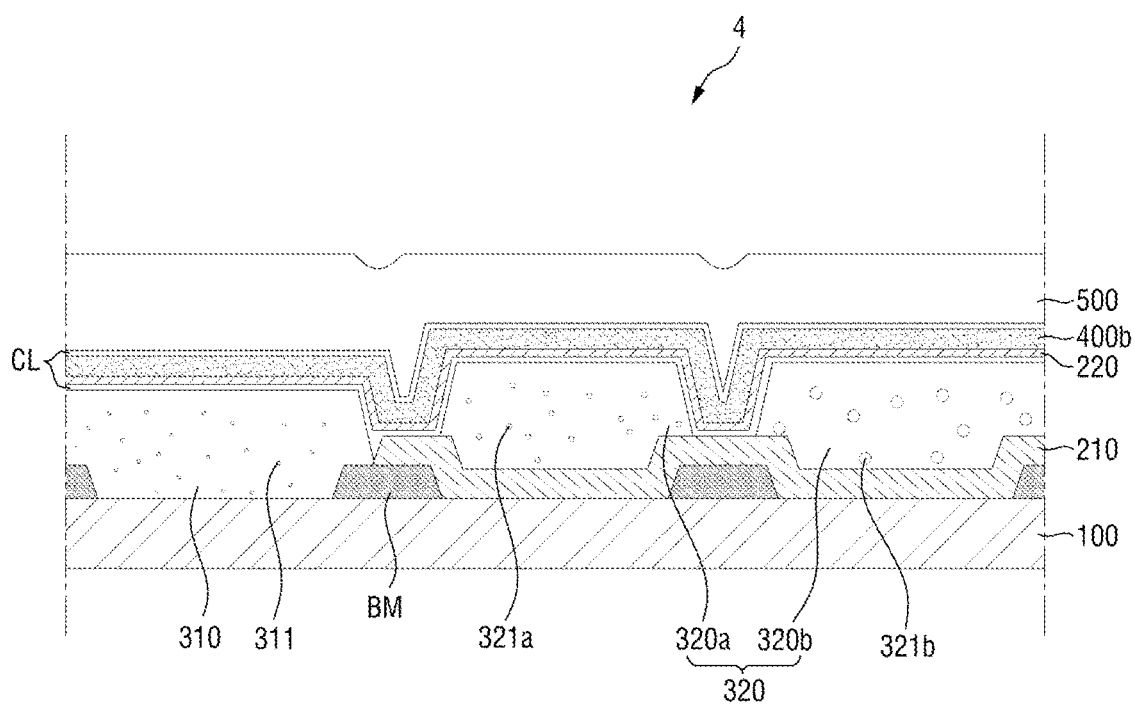
FIGS. 9-12 are cross-sectional views of color conversion elements according to embodiments.
Figure 10:
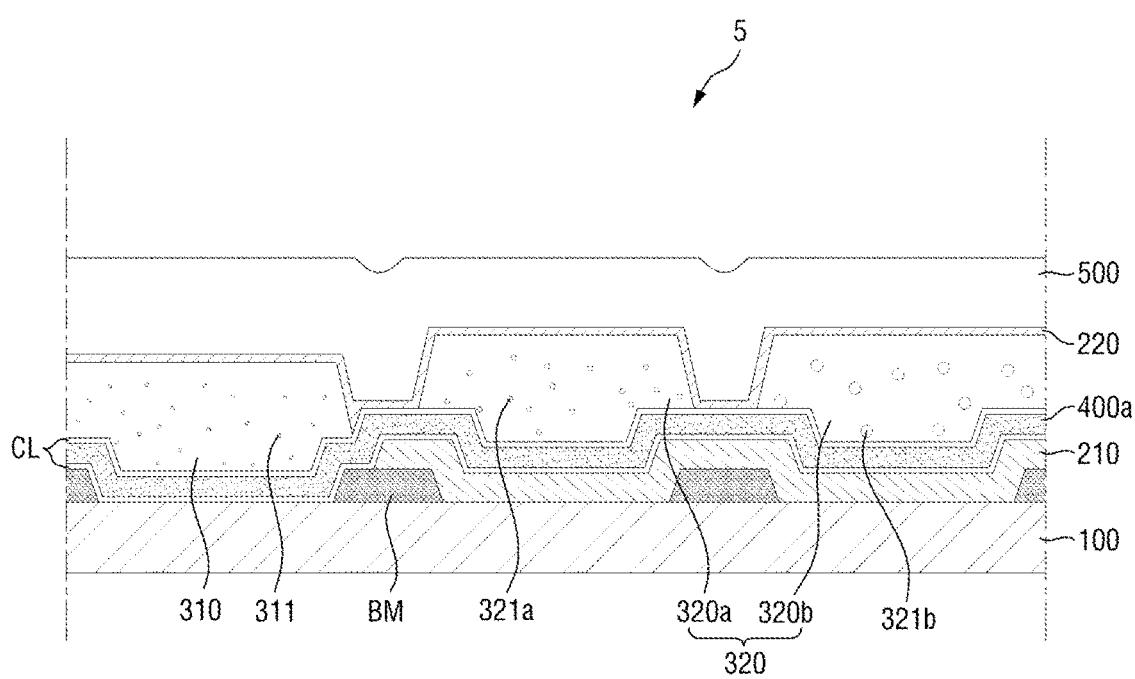

FIGS. 9-10 are cross-sectional views of color conversion elements 4 and 5 according to embodiments.

The color conversion elements 4 and 5 of FIGS. 9-10 are substantially the same as the color conversion element 2 described above with reference to FIGS. 5-6, except that a first low refractive layer 400a or a second low refractive layer 400b is omitted.

Referring to FIGS. 9-10, the first low refractive layer 400a disposed under wavelength conversion pattern layers 320 and the second low refractive layer 400b disposed on the wavelength conversion pattern layers 320 may be selectively omitted according to the characteristics of the wavelength conversion pattern layers 320, application fields of the color conversion elements 4 and 5, a user's preference, etc.

Figure 11:
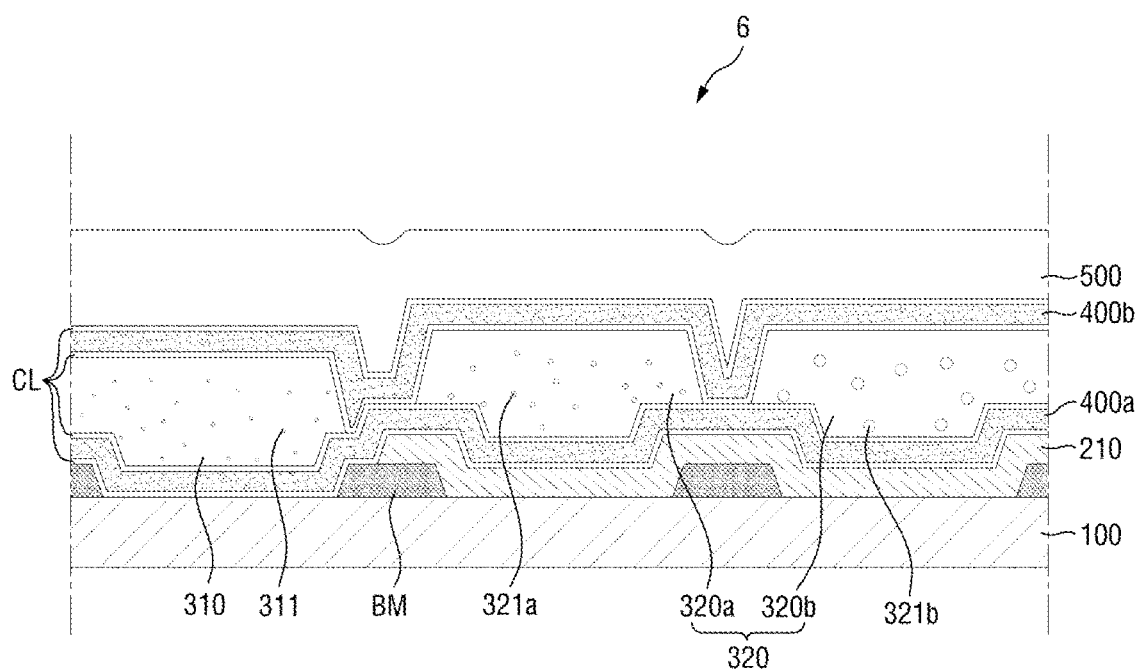

FIG. 11 is a cross-sectional view of a color conversion element 6 according to an embodiment.

The color conversion element 6 of FIG. 11 is substantially the same as the color conversion element 2 described above with reference to FIGS. 5-6, except that a second wavelength band filter layer 220 is omitted. Hereinafter, any redundant description will not be repeated, and the current embodiment will be described, focusing mainly on differences with the pervious embodiment.

Referring to FIG. 11, the second wavelength band filter layer 220 disposed between wavelength conversion pattern layers 320 and a second low refractive layer 400b may be omitted.

The second low refractive layer 400b disposed on the wavelength conversion pattern layers 320 can reflect light, which is scattered in the upward direction by wavelength conversion particles 321a and 321b, in the downward direction. Therefore, the second low refractive layer 400b can substantially perform the function of the second wavelength band filter layer 220. For this reason, the second wavelength band filter layer 220 may be omitted.

Figure 12:
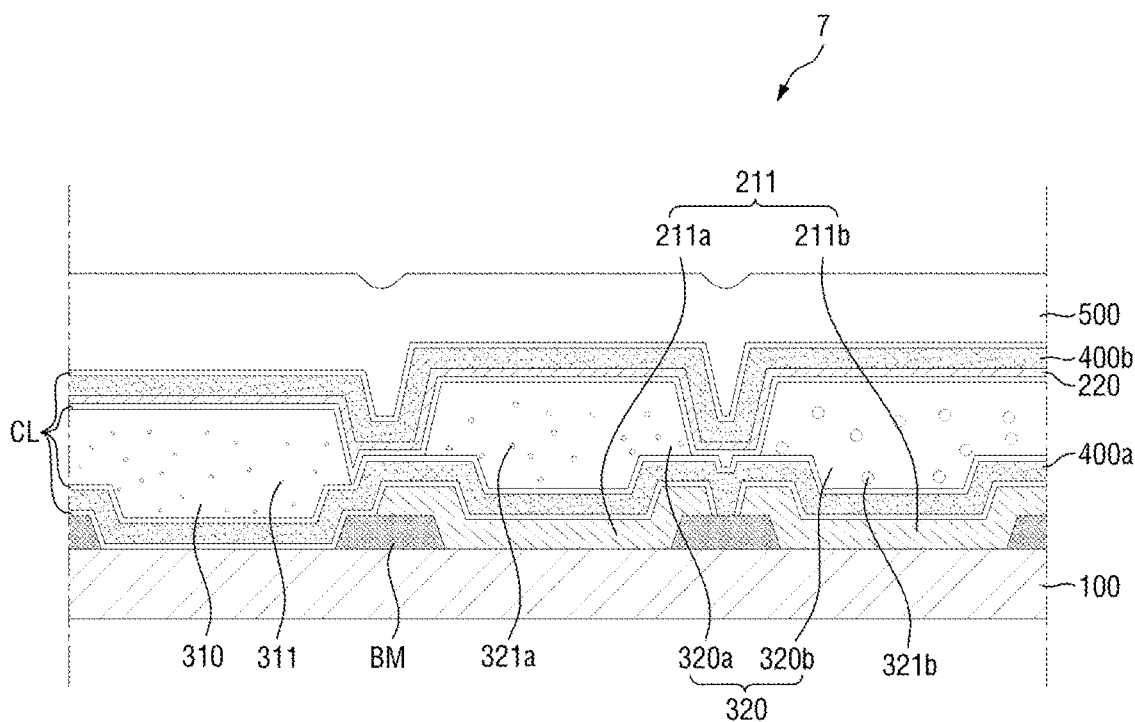

FIG. 12 is a cross-sectional view of a color conversion element 7 according to an embodiment.

The color conversion element 7 of FIG. 12 is substantially the same as the color conversion element 2 described above with reference to FIGS. 5-6, except that a first wavelength band filter layer 211 is divided into a first sub-filter layer 211a and a second sub-filter layer 211b. Hereinafter, any redundant description will not be repeated, and the current embodiment will be described, focusing mainly on differences with the pervious embodiment.

Referring to FIG. 12, the first wavelength band filter layer 211 may be divided into the first sub-filter layer 211a disposed under a first wavelength conversion pattern layer 320a and the second sub-filter layer 211b disposed under a second wavelength conversion pattern layer 320b.

The first sub-filter layer 211a may transmit light of the first color while blocking the transmission of light of the third color, and the second sub-filter layer 211b may transmit light of the second color while blocking the transmission of light of the third color.

In an embodiment, the first sub-filter layer 211a may be made of an organic layer having a yellow or green color, and the second sub-filter layer 211b may be made of an organic layer having a red color. However, each of the first and second sub-filter layers 211a and 211b can also be made of an organic layer having a yellow color.

Figure 13:
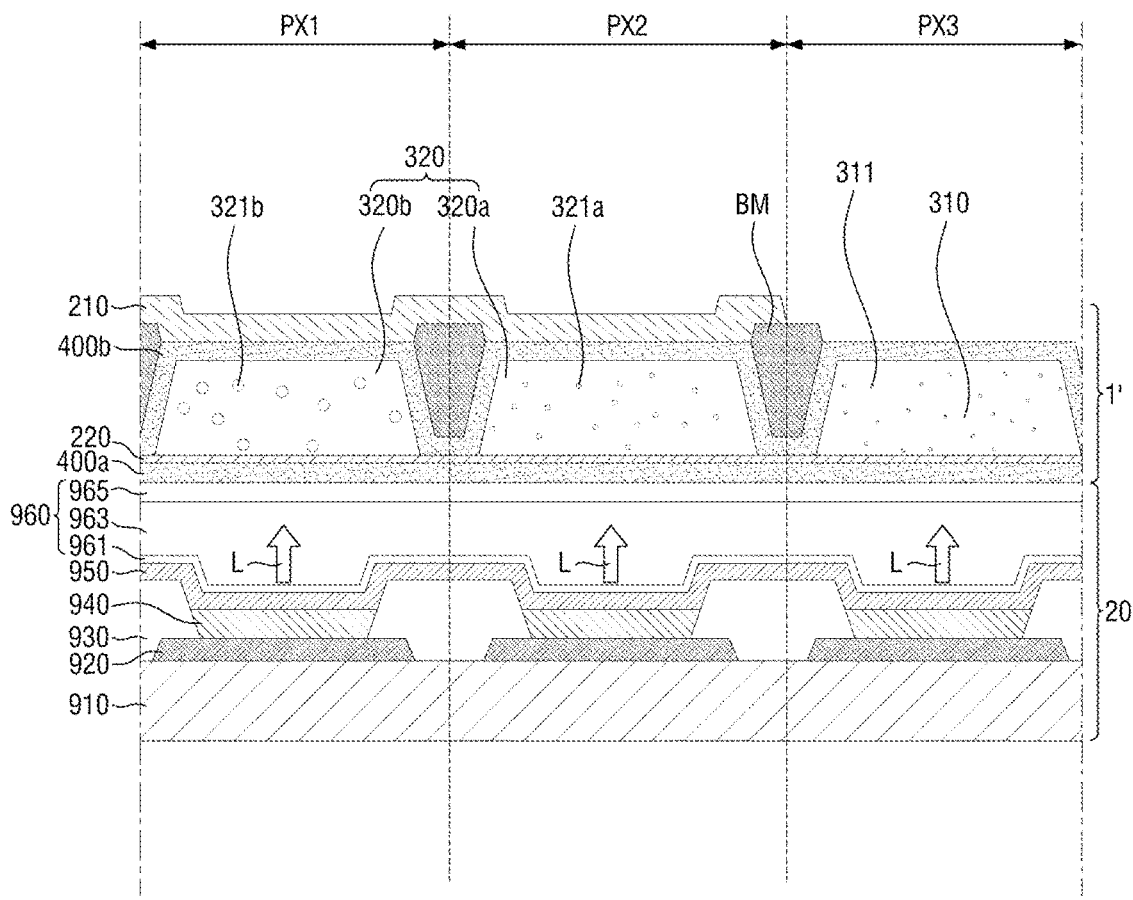
FIG. 13 is a cross-sectional view of a display device according to an embodiment.

FIG. 13 is a cross-sectional view of a display device according to an embodiment. The display device of FIG. 13 is substantially the same as the display device described above with reference to FIG. 4, except that a display element 20 is not a liquid crystal display element 10 but an organic light-emitting display element 20. Hereinafter, any redundant description will not be repeated, and the current embodiment will be described, focusing mainly on differences with the pervious embodiment.

Referring to FIG. 13, the display device includes the display element 20 and a color conversion element 1' disposed directly on the display element 20.

The display element 20 includes a support substrate 910, a first electrode 920, a pixel defining layer 930, a light emitting layer 940, a second electrode 950, and a thin-film encapsulation layer 960.

The support substrate 910 provides a space for accommodating elements such as the light emitting layer 940 and may be a driving substrate including wiring, electrodes, semiconductors, insulating layers, etc. for driving the display element 20.

The first electrode 920 may be disposed on the support substrate 910. The first electrode 920 may be disposed in an area corresponding to each pixel PX1, PX2 or PX3 of the display element 20. The first electrode 920 may be a pixel electrode or an anode of the display element 20.

The pixel defining layer 930 may be disposed on the support substrate 910. In a plan view, the pixel defining layer 930 may define a plurality of pixels in the display element 20 through openings. An opening may expose at least part of the first electrode 920 in each pixel.

The light emitting layer 940 may be disposed on the first electrode 920 exposed by each of the openings. The light emitting layer 940 may be an organic light-emitting layer including an organic material that emits light through excitons formed by holes and electrons. The light emitting layer 940 may further include one or more of a hole injection layer, a hole transport layer, an electron transport layer, and an electron injection layer.

In some embodiments, the light emitting layers 940 respectively disposed in the pixels PX1 through PX3 may all be blue light emitting layers. For example, light L emitted from each light emitting layer 940 may be blue light.

In some embodiments, each of the light emitting layers 940 may include only one blue light emitting layer. In some embodiments, each of the light emitting layers 940 may include two or more blue light emitting layers and may further include a charge generation layer located between the two blue light emitting layers.

The second electrode 950 may be disposed on the light emitting layer 940. The second electrode 950 may cover both the light emitting layer 940 and the pixel defining layer 930. The second electrode 950 may be a common electrode or a cathode of the display element 20.

The thin-film encapsulation layer 960 may be disposed on the second electrode 950. In some embodiments, the thin-film encapsulation layer 960 may be disposed to cover all of the pixels PX1 through PX3. In some embodiments, a capping layer may be further disposed between the thin-film encapsulation layer 960 and the second electrode 950 to cover the second electrode 950. In this case, the thin-film encapsulation layer 960 may directly cover the capping layer (e.g., the thin-film encapsulation layer 960 may physically contact the capping layer).

The thin-film encapsulation layer 960 may seal the display element 20 to prevent foreign matter or moisture from penetrating into the light emitting layer 940 (or to reduce a likelihood or amount of the penetration of foreign matter or moisture from penetrating into the light emitting layer 940). The thin-film encapsulation layer 960 may planarize an upper surface of the display element 20.

In some embodiments, the thin-film encapsulation layer 960 may include a first encapsulating inorganic film 961, an encapsulating organic film 963, and a second encapsulating inorganic film 965 sequentially stacked on the second electrode 950.

In some embodiments, each of the first encapsulating inorganic film 961 and the second encapsulating inorganic film 965 may each independently be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride.

In some embodiments, the encapsulating organic film 963 may be made of acrylic resin, methacrylic resin, polyisoprene, vinyl resin, epoxy resin, urethane resin, cellulose resin, and/or perylene resin.

However, the structure of the thin-film encapsulation layer 960 is not limited to the foregoing description, and the lamination structure of the thin-film encapsulation layer 960 can be variously changed.

The color conversion element 1' may be disposed on the display element 20, for example, on the thin-film encapsulation layer 960 of the display element 20.

The color conversion element 1' includes a light shielding member BM, a first wavelength conversion pattern layer 320a, a second wavelength conversion pattern layer 320b, a light-transmitting pattern layer 310, a first low refractive layer 400a and a second low refractive layer 400b and may further include a first wavelength band filter layer 210 and a second wavelength band filter layer 220. Hereinafter, any redundant description of features that have already been described herein will not be repeated. Rather, the following description primarily relates to the differences with the above description.

The first low refractive layer 400a may be located on the thin-film encapsulation layer 960.

The second wavelength band filter layer 220 may be located on the first low refractive layer 400a. As described above, the second wavelength band filter layer 220 may transmit light of the third color, for example, blue light and reflect light having a longer wavelength than the third color, for example, red light and green light. In some embodiments, the second wavelength band filter layer 220 may be disposed over the pixels PX1 through PX3. In an embodiment, the second wavelength band filter layer 220 may be omitted as described above.

The wavelength conversion pattern layers 320a and 320b and the light-transmitting pattern layer 310 may be located on the second wavelength band filter layer 220. The wavelength conversion pattern layers 320a and 320b and the light-transmitting pattern layer 310 may be arranged to correspond to the pixels PX1 through PX3 of the display element 20, respectively.

The second low refractive layer 400b may be located on the wavelength conversion pattern layers 320a and 320b and the light-transmitting pattern layer 310, and the light shielding member BM may be located on the second low refractive layer 400b. The light shielding member BM may be disposed to correspond to the boundary of each of the pixels PX1 through PX3.

The first wavelength band filter layer 210 may be disposed on the second low refractive layer 400b. In some embodiments, the first wavelength band filter layer 210 may cover at least a part of the light shielding member BM. In some embodiments, the first wavelength band filter layer 210 may not be disposed in the third pixel PX3 and may be disposed in both the first pixel PX1 and the second pixel PX2. In an embodiment, the first wavelength band filter layer 210 may be changed to a first sub-filter layer 211a (see FIG. 12) corresponding to the second pixel PX2 and a second sub-filter layer 211b (see FIG. 12) corresponding to the first pixel PX1, as described above with reference to FIG. 12. Further, in some embodiments, a color filter of the third color, for example, a blue color filter may be disposed in the third pixel PX3 as described above.

Light L emitted from the light emitting layers 940 of the display element 20 is provided to the color conversion element 1', and the color conversion element 1' receives the light L from the display element 20 and emits light of a color corresponding to each of the pixels PX1 through PX3 as described above.

For example, when light L emitted from the light emitting layer 940 in the first pixel PX1 is blue light, the light L passes through the first low refractive layer 400a and the second wavelength band filter layer 220 to enter the second wavelength conversion pattern layer 320b. In the second wavelength conversion pattern layer 320b, the blue light is converted into light of the second color (e.g., red light). The light of the second color is transmitted through the first wavelength band filter layer 210 to the outside.

In addition, blue light L emitted from the light emitting layer 940 in the second pixel PX2 passes through the first low refractive layer 400a and the second wavelength band filter layer 220 to enter the first wavelength conversion pattern layer 320a. In the first wavelength conversion pattern layer 320a, the blue light is converted into light of the first color (e.g.; green light). The light of the first color is transmitted through the first wavelength band filter layer 210 to the outside.

In addition, blue light L emitted from the light emitting layer 940 in the third pixel PX3 passes through the first low refractive layer 400a and the second wavelength band filter layer 220 to enter the light-transmitting pattern layer 310. Then, the blue light L is transmitted through the light-transmitting pattern layer 310 to the outside.

Figure 14:
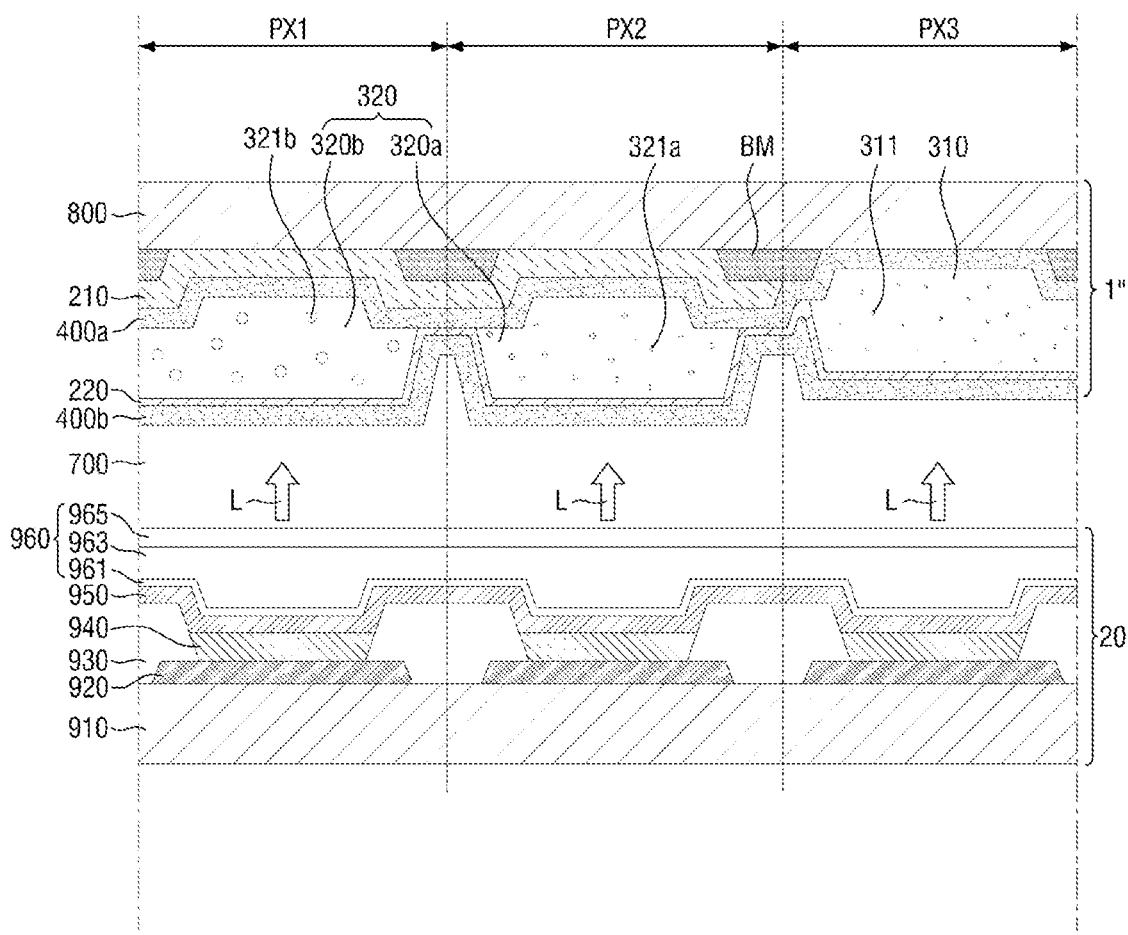
FIG. 14 is a cross-sectional view of a display device according to an embodiment.

FIG. 14 is a cross-sectional view of a display device according to an embodiment. The display device of FIG. 14 is substantially the same as or similar to the embodiment of FIG. 13 except for the position of a color conversion element 1". Hereinafter, any redundant description of features that have already been described herein will not be repeated. Rather, the following description primarily relates to the differences with the above description.

The color conversion element 1" faces a display element 20.

The color conversion element 1" includes a substrate 800, a light shielding member BM, a first wavelength conversion pattern layer 320a, a second wavelength conversion pattern layer 320b, a light-transmitting pattern layer 310, a first low refractive layer 400a, and a second low refractive layer 400b, and may further include a first wavelength band filter layer 210 and a second wavelength band filter layer 220.

The light shielding member BM is located on the surface of the substrate 800 facing the display element 20 and is disposed to correspond to the boundary of each pixel PX1, PX2 or PX3.

The first wavelength band filter layer 210 is located on the surface of the substrate 800 and is disposed to correspond to the first pixel PX1 and the second pixel PX2. However, embodiments are not limited to this case, and the first wavelength band filter layer 210 may also be changed to be a first sub-filter layer 211a (see FIG. 12) corresponding to the second pixel PX2 and a second sub-filter layer 211b (see FIG. 12) corresponding to the first pixel PX1 as described above. In some embodiments, the first wavelength band filter layer 210 may cover the light shielding member BM. In some embodiments, a color filter of the third color, for example, a blue color filter corresponding to the third pixel PX3 may also be disposed on the surface of the substrate 800 as described above.

The first low refractive layer 400a may be disposed on the first wavelength band filter layer 210 and may be disposed over the pixels PX1 through PX3.

The wavelength conversion pattern layers 320a and 320b and the light-transmitting pattern layer 310 may be located on the first low refractive layer 400a.

The second wavelength band filter layer 220 may be disposed on the wavelength conversion pattern layers 320a and 320b and the light-transmitting pattern layer 310, and the second low refractive layer 400b may be disposed on the second wavelength band filter layer 220.

A filler 700 may be located between the second low refractive layer 400b and a thin-film encapsulation layer 960.

Figure 15:
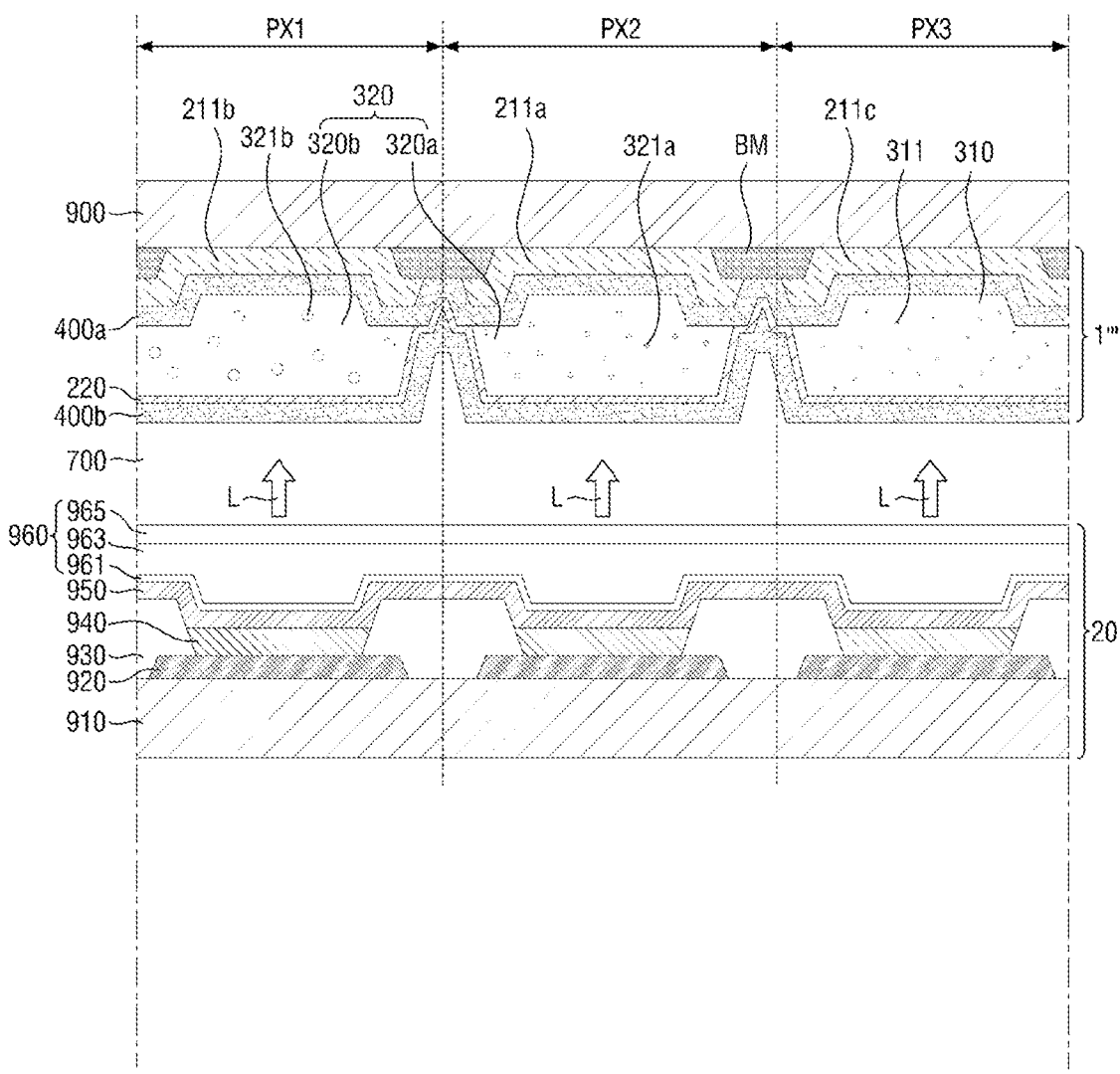
FIG. 15 is a cross-sectional view of a display device according to an embodiment.

FIG. 15 is a cross-sectional view of a display device according to an embodiment. The display device of FIG. 15 is substantially the same as or similar to the embodiment of FIG. 14, except that a color conversion element 1''' does not include a first wavelength band filter layer (210 in FIG. 14) and includes a first sub-filter layer 211a, a second sub-filter layer 211b, and a third sub-filter layer 211c, Hereinafter, any redundant description of features that have already been described herein will not be repeated. Rather, the following description primarily relates to differences with the above description.

The first sub-filter layer 211a, the second sub-filter layer 211b, and the third sub-filter layer 211c may be located on a surface of the substrate 800 as described above.

The first sub-filter layer 211a may block light of the third color and light of the second color and transmit light of the first color. For example, the first sub-filter layer 211a may be a green color filter.

The second sub-filter layer 211b may block light of the third color and light of the first color and transmit light of the second color. For example, the second sub-filter layer 211b may be a red color filter.

The third sub-filter layer 211c may block light of the first color and light of the second color and transmit light of the third color. For example, the third sub-filter layer 211c may be a blue color filter. In some embodiments, the third sub-filter layer 211c may be omitted as in the above-described embodiments.

In some embodiments, each of the color conversion elements of the embodiments of FIGS. 13 through 15 may further include a plurality of capping layers as in the embodiment of FIG. 5 and the embodiment of FIG. 7. In addition, each of the color conversion elements of the embodiments of FIGS. 13 through 15 may be changed to have a structure in which the first low refractive layer 400a and the second low refractive layer 400b are omitted as in the embodiment of FIG. 9 or may be changed to have a structure in which the second wavelength band filter layer 220 is omitted as in the embodiment of FIG. 11.

While the subject matter of the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

Embodiments provide at least one of the following features.

A low refractive layer disposed on and under a layer containing wavelength conversion particles or a scatterer enables light to be recycled, thereby improving light efficiency, luminance, etc.

A capping layer disposed on and under the low refractive layer can prevent the low refractive layer from being damaged by an adjacent organic material layer in a subsequent process (or can reduce a likelihood or amount of such damage).

Therefore, the function of the low refraction layer is not degraded.

However, the effects of the embodiments are not restricted to the one set forth herein. The above and other effects of the embodiments will become more apparent to one of daily skill in the art to which the embodiments pertain by referencing the claims.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration. In the drawings, the relative sizes of elements, layers, and regions may be exaggerated for clarity.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

What is claimed is:

1. A color conversion element comprising:
   a base layer;
   a first wavelength conversion pattern disposed on the base layer;
   a low refractive layer disposed between the base layer and the first wavelength conversion pattern; and
   a first inorganic layer disposed on the first wavelength conversion pattern, wherein the first inorganic layer comprises one or more selected from silicon oxide, silicon nitride and silicon oxynitride.

2. The color conversion element of claim 1, further comprising:
   a second wavelength conversion pattern disposed on the base layer,
   wherein the low refractive layer is disposed between the base layer and the second wavelength conversion pattern,
   wherein the first wavelength conversion pattern includes a first quantum dot,
   wherein the second wavelength conversion pattern includes a second quantum dot, and
   wherein a size of the first quantum dot is different from a size of the second quantum dot.

3. The color conversion element of claim 1,
   wherein a refractive index of the low refractive layer is lower than a refractive index of the first wavelength conversion pattern, and
   wherein the refractive index of the low refractive layer is 1.3 or less.

4. The color conversion element of claim 1, wherein the low refractive layer comprises inorganic particles, each of the inorganic particles having a hole.

5. The color conversion element of claim 4, wherein the low refractive layer further comprises a resin, and the inorganic particles are dispersed in the resin.

6. The color conversion element of claim 5, wherein a weight ratio of the inorganic particles and the resin contained in the low refractive layer is 1.5:1 to 4:1.

7. The color conversion element of claim 4, wherein the inorganic particles comprise one or more selected from silica ($SiO_2$), magnesium fluoride ($MgF_2$), and iron oxide ($Fe_3O_4$).

8. The color conversion element of claim 1, further comprising:
   a color filter disposed between the base layer and the low refractive layer; and
   a second inorganic layer disposed between the low refractive layer and the first wavelength conversion pattern.

9. The color conversion element of claim 8,
   wherein the second inorganic layer comprises one or more selected from silicon oxide, silicon nitride and silicon oxynitride.

10. The color conversion element of claim 1, further comprising an organic layer which is disposed on the first wavelength conversion pattern, wherein the first inorganic layer is disposed between the first wavelength conversion pattern and the organic layer.

11. The color conversion element of claim 10,
    wherein the organic layer comprises one or more selected from cardo-based material, polyimide material, acrylic-based material, siloxane material and silsesquioxane material.

12. The color conversion element of claim 1, further comprising a light transmitting pattern disposed on the base layer,
    wherein the low refractive layer is disposed between the base layer and the light transmitting pattern, and
    wherein the light transmitting pattern does not overlap the first wavelength conversion pattern.

13. The color conversion element of claim 12, wherein the light transmitting pattern comprises a scatterer, and wherein the scatterer comprises one or more selected from SiO2, TiO2, ZrO2, Al2O3, In2O3, ZnO, SnO2, and Sb2O3.

14. The color conversion element of claim 1, further comprising a light shielding member disposed between the low refractive layer and the base layer,
wherein the light shielding member includes a blue colorant.

15. A display device comprising:
a display element; and
a color conversion element disposed on the display element,
wherein the color conversion element comprises:
a wavelength conversion pattern disposed on the display element;
a low refractive layer disposed on the wavelength conversion pattern; and
an inorganic layer disposed between the low refractive layer and the wavelength conversion pattern,
wherein the inorganic layer comprises one or more selected from silicon oxide, silicon nitride and silicon oxynitride.

16. The display device of claim 15,
wherein the low refractive layer has a lower refractive index than the wavelength conversion pattern, and
wherein the refractive index of the low refractive layer is 1.3 or less.

17. The display device of claim 15, further comprising:
a light transmitting pattern disposed between the display element and the low refractive layer,
wherein the inorganic layer is disposed between the low refractive layer and the light transmitting pattern, and
wherein the light transmitting pattern does not overlap the wavelength conversion pattern.

18. The display device of claim 15, further comprising a second inorganic layer disposed between the wavelength conversion pattern and the display element.

19. The display device of claim 15, further comprising a color filter disposed on the low refractive layer, the color filter overlapping the wavelength conversion pattern.

20. The display device of claim 15, wherein the display element includes at least two blue light emitting layers, and
wherein the at least two blue light emitting layers overlap the wavelength conversion pattern.

* * * * *